United States Patent [19]
Lajoie et al.

[11] Patent Number: 5,112,406
[45] Date of Patent: May 12, 1992

[54] PROCESS FOR REMOVING COATINGS FROM SENSITIVE SUBSTRATES, AND SODIUM SULFATE-CONTAINING BLASTING MEDIA USEFUL THEREIN

[75] Inventors: Michael S. Lajoie, Basking Ridge; Lawrence Kirschner, Flanders, both of N.J.

[73] Assignee: Church & Dwight Co., Inc., Princeton, N.J.

[21] Appl. No.: 801,758

[22] Filed: Dec. 3, 1991

[51] Int. Cl.⁵ .............................. B08B 7/00; B24C 1/08
[52] U.S. Cl. ............................................. 134/7; 134/38; 51/307; 51/308; 51/319; 51/320; 252/174.15
[58] Field of Search ............... 134/7, 38; 51/307, 308, 51/319, 320; 252/89.1, 174.15; 423/193, 199

[56] References Cited

U.S. PATENT DOCUMENTS

| | | | |
|---|---|---|---|
| 4,249,956 | 2/1981 | Hartman | 134/7 |
| 4,511,489 | 4/1985 | Requejo et al. | 252/174.15 |
| 4,552,777 | 11/1985 | Dente et al. | 252/174.15 |
| 4,575,396 | 3/1986 | Matsumoto et al. | 134/7 |
| 4,731,125 | 3/1988 | Carr | 134/7 |

FOREIGN PATENT DOCUMENTS 532346 10/1956 Canada .................................. 134/6

*Primary Examiner*—Theodore Morris
*Assistant Examiner*—Saeed Chandhry
*Attorney, Agent, or Firm*—Bryan, Cave, McPheeters & McRoberts

[57] ABSTRACT

Blasting media for removing coatings from sensitive metal and composite surfaces, and a process useful therewith, wherein the blasting media comprise mixtures of water-soluble crystalline sodium sulfate particles having average particle sizes of from 100 to 250 microns, in admixture with flow/anticaking agents.

10 Claims, No Drawings

PROCESS FOR REMOVING COATINGS FROM SENSITIVE SUBSTRATES, AND SODIUM SULFATE-CONTAINING BLASTING MEDIA USEFUL THEREIN

FIELD OF THE INVENTION

This invention relates to a process for removing coatings from sensitive metal and composite surfaces or like substrates, and to blasting media containing sodium sulfate useful therein.

BACKGROUND OF THE INVENTION

Commercial airlines and military agencies spend large sums in periodically stripping or abrading paint and other coatings from the exterior surfaces of modern aircraft. These surfaces comprise light weight aluminum or other metal alloys, composites, or plastics, which are relatively soft and from which paint or other coatings must be carefully removed to avoid excessive abrasion or chemical damage. Such damage may, in extreme cases, lead to mechanical failure.

Blasting media useful for removing coatings from sensitive metal and composite aircraft or like surfaces should, preferably, meet the following criteria:

1. They should be relatively non-aggressive (Mohs hardness of about 2.0-3.0);
2. They should be available in various particle size distributions for the treatment of different substrates;
3. They should be free-flowing under high humidity conditions and throughout a broad range of air pressure and media flow rates;
4. They should be water soluble and non-polluting to facilitate easy separation from the insoluble paints and resins stripped to facilitate waste disposal; and
5. They should be non-corrosive to substrates and adjoining surfaces contacted by the blasting media.

Sand blasting, the principal means for cleaning or stripping hard durable surfaces such as granite or heavy steel plating, is too abrasive for removing coatings from sensitive substrates. Blasting techniques have therefore been used on sensitive substrates that employ materials softer than sand, such as plastic materials, walnut shells, and corn cobs. The disadvantages of these softer materials are that they are insoluble and therefore not easily disposable. Additionally, plastics are also expensive.

A blasting medium for removing coatings from sensitive substrates containing water-soluble bicarbonate particles, preferably sodium bicarbonate, having average particle sizes of 100 to 500 microns, in admixture with a hydrophobic silica flow/anti-caking agent, has been developed by the owners of the present invention as taught in U.S. application Ser. No. 07/323,412 (International Application No. PCT/US90/04203), U.S. application Ser. No. 07/506,447, and U.S. application Ser. No. 07/702,049. Although effective in removing coatings from substrates, the larger particle sizes of bicarbonate makes it a less efficient blasting medium than blasting media employing compounds with small particle sizes, such as fine sand, which have better cutting efficiencies. Additionally, more water is needed to wash away the waste produced by bicarbonate-containing blasting medium than is generally used in commercial blasting systems because of the relatively low solubility of bicarbonate in water.

SUMMARY OF THE INVENTION

It is among the objects of the present invention to provide sodium sulfate-containing blasting media, and a process utilizing such media for removing coatings from sensitive hard surfaces. e.g., sensitive metal composite surfaces, masonry, stucco, plaster, wood etc. Sodium sulfate blasting media which may be so utilized efficiently remove coatings from substrates, use less water for waste removal, and are relatively inexpensive, compared to bicarbonate-containing blasting media. Sodium sulfate blasting media may be utilized as blasting media in pressured air blast systems and at high humidities and under a broad range of finely controlled, high flow rates and air pressures.

Other objects and advantages of the invention will be apparent from the following description of preferred forms thereof.

DETAILED DESCRIPTION OF THE INVENTION

In accordance with this invention, a process for removing coatings from sensitive substrates is provided, comprising blasting such surfaces with a high velocity water-containing fluid stream, suitably a substantially water-saturated compressed air stream, under a pressure of about 10 to 100 psi, containing as a blasting medium crystalline sodium sulfate particles having average particle sizes within the range of about 50 to 1000 microns, preferably about 150 to 500 microns, in admixture with at least about 0.05 to 2.0%, preferably about 0.1 to 0.5%, of a hydrophobic silica flow/anti-caking agent, a hydrophobic polysiloxane anticaking agent, or a mixture of such agents, by weight of the sulfate.

Hydrophobic silica, unlike known hydrophilic silicas, is substantially free of non-hydrogen bonded silanol group and absorbed water. One preferred hydrophobic silica which may be utilized in the blasting media hereof is Aerosil R 972, a product which is available from Degussa AG. This material is a pure coagulated silicon dioxide aerosol, in which about 75% of the silanol groups on the surface thereof are chemically reacted with dimethyldichlorosilane, the resulting product having about 0.7 mmol of chemically combined methyl groups per 100 $m^2$ of surface area and containing about 1% carbon. Its particles vary in diameter from about 10 to 40 nanometers and have a specific surface area of about 110 $m^2$/gram. It may be prepared by flame hydrolysis of a hydrophilic silica as more fully described in Angew. Chem. 72, 744 (1960); F-pS 1,368,765; and DT-AS 1,163,784. Further details respecting such material are contained in the technical bulletin entitled "Basic Characteristics and Applications of AEROSIL", Degussa AG, August 1986. The hydrophobic silica particles are admixed with the crystalline sodium sulfate blasting agent in the proportion of at least about 0.1 and up to about 1.0% by weight thereof. Another hydrophobic silica is Quso, marketed by DeGussa A.G.

Hydrophobic polysiloxanes, preferably non-halogenated polysiloxanes, suitable for use in the blasting media hereof are commercially marketed by Dow Corning and general Electric.

Blasting media thus constituted are useful for efficiently cleaning or de-coating sensitive metals, e.g., aluminum or aluminum alloys, magnesium or composite substrates, such as utilized on exterior aircraft surfaces, masonry, stucco, plaster or wood. Such blasting media are preferably applied in commercial compressed air streams, i.e., streams which are substantially saturated with moisture (90% or higher relative humidities) and which may contain oil contaminants from compressors; in commercial pressured water blast systems; or in commercial combination pressurized air-water blast systems. In the latter, a stream of water is added to the media/air stream to cool the workpiece and control dust formation, although the addition of water may reduce the coating removal rate somewhat.

The sodium sulfate/hydrophobic silica blasting medium may be applied at flow rates of about 0.5 to 15, desirably about 1.0 to 4.0, pounds per minute and under air pressures of about 10 to 100 psi, from ⅛ inch or larger blasting nozzles.

As indicated above, and as more fully documented below, in accordance with the present invention it has been found that blasting media so constituted and applied do not cake, have excellent shelf lives, and are free-flowing. They may thus be readily employed in commercial blasting operations for removing coatings from sensitive hard surfaces.

The following examples illustrate the free-flowing characteristics of (Example 1), the high production rates obtained by (Example 2), and the cutting efficiencies obtained by (Example 3), the blasting media of the present invention. In the examples, all parts and percentages are given by weight and all temperatures in °F. unless otherwise indicated.

EXAMPLE 1

Comparative Flow Rates of Sodium Sulfate And Other Blasting Media

A first crystalline sodium sulfate (Sample 1), having an average particle size of about 250 microns, a second crystalline sodium bicarbonate sample (Sample 2, the control), having an average particle size of about 275 microns, each in admixture with 0.5% Aerosil R-972 hydrophobic silica, and a third crystalline sodium sulfate sample (Sample 3), having an average particle size of about 250 microns, were used as media in a standard sand blasting apparatus. The apparatus was a Schmidt Accustrip System, manufactured by Schmidt Manufacturing, Inc. of Houston, Tex., having a 0.5 inch nozzle diameter and a Thompson valve with a 0.140" Thompson Seat ("T.S.") connected to a 6 cubic foot blast pot and an 800 cfm compressor. The blast pot was mounted on a scale so that media flow rates could be determined.

The respective sulfate and bicarbonate formulations were blasted through the nozzle at 60 psi pressure utilizing ambient compressed air as it passed through the blasting media in the blast pot.

Sample 3, crystalline sodium sulfate particles absent the hydrophobic silica flow aid, would not flow through the system.

On the other hand, Samples 1 and 2, the crystalline sodium sulfate and sodium bicarbonate silica formulations, flowed continuously through the system at controllable rates from approximately 0.5 to 3.5 pounds per minute. At each change in the differential pressure (Delta P), five test runs were made with the change in weight of the sample measured over a 60 second period to give the flow rate in pounds per minute (#/min). The data from the five test runs were then averaged and the standard deviation (s.d.) calculated. The following average flow rates were determined in the respective tests:

TABLE 1

Comparative Flow Rates of Sodium Sulfate and Sodium Bicarbonate Blasting Media

| Delta P | Sodium Sulfate Media | | Sodium Bicarbonate Media | |
|---|---|---|---|---|
| | #/min | s.d. | #/min | s.d. |
| 1 | .66 | .16 | 1.1 | .10 |
| 2 | 1.13 | .45 | 1.7 | .06 |
| 3 | 2.48 | .28 | 2.16 | .14 |
| 4 | 3.12 | .16 | 2.66 | .05 |

The preceding data demonstrates that both sodium sulfate and sodium bicarbonate blasting media containing hydrophobic silica flow aids flow well, although the sulfate blasting media flow rate is a little more erratic and the flow change in response to the change in pressure is steeper than corresponding parameters employing the sodium bicarbonate blasting media.

A fourth blasting media sample, Sample 4, containing sodium borate, another material meeting criteria 1, 2 and 4 above, commercially available under the "BORAX" trademark, was also tested. The sodium borate was run through a coarse screen to remove big chunks, then admixed with 0.5% Aerosil R-972 hydrophobic silica. The resulting media was used in the same test apparatus as above, except that a 0.156" T.S. orifice was used. The following flow rates were obtained:

TABLE 2

Comparative Flow Rates of Sodium Borate-Containing Blasting Media

| Delta P | #/min | s.d. | trial # |
|---|---|---|---|
| 3 | 2.7 | .61 | 1 |
| 3 | 1.5 | .69 | 2 |
| 4 | 2.9 | .30 | 1 |
| 4 | 2.5 | .32 | 2 |
| 5 | 2.7 | .07 | 1 |
| 5 | 3.3 | .20 | 2 |
| 5 | 3.4 | .23 | 3 |

The above data shows that borate blasting media are not viable alternatives as they do not respond to changes in the differential pressure, their flow rates are not predictable, and their flows are difficult to control. In contrast, as indicated in TABLE 1, sulfate blasting media respond to changes in differential pressure and their flow can be controlled.

EXAMPLE 2

Comparative Production Rates Obtained With Sodium Sulfate and Other Blasting Media One sq. ft. aluminum test panels (standard aircraft aluminum alloy with a thin surface layer of aluminum, Al 2024T3 Alclad) coated with an epoxy resin primer and a polyurethane topcoat in accordance with military specifications (MIL-C-83285B and MIL-P-23377E) were subjected to saturated air blasts containing the varying blasting media described below. The media were applied at a flow rate of 3 pounds per minute under 60 psi blast pressure, with the blast nozzle standing off from the test panels by 18 inches and utilizing a 60° blast angle. Water was fed into the saturated air blast stream under 200 psi, at a rate of 0.4 gallons per minute.

Blasting media containing sodium sulfate having a 250 micron approximate average particle size (Sample 1), blasting media containing sodium bicarbonate having a 275 micron approximate average particle size (Sample 2), and blasting media containing sodium borate (Sample 4) were tested. 0.5% hydrophobic silica (Aerosil R 972) flow additives were added to the blasting media containing the respective sulfate, bicarbonate, and borate abrasives. The following production (depainting) rates were determined in the respective tests:

TABLE 3

Comparative Production Rates of Sodium Sulfate and Other Blasting Media

| Type of Media | Blast Time[1] | Media Consumed[2] | Production Rate[3] |
| --- | --- | --- | --- |
| Sodium Sulfate | 60 seconds | 4.49 | 1.97 |
| Sodium Bicarbonate | 89 seconds | 3.05 | 1.31 |
| Sodium Borate[4] | 360 seconds | 28.00 | 0.28 |

[1] Time required to effect complete coating removal, average of eight tests.
[2] In #/ft.², average of eight tests.
[3] In mils × ft.²/min., average of eight tests.
[4] Results from one test From the preceding it will be seen that the sodium sulfate-containing blasting media had a significantly higher production rate in less time than both the sodium bicarbonate-containing and sodium borate-containing blasting media. The sodium sulfate-containing media achieved considerably greater paint removal with considerably less media consumption. The borate-containing blasting media was extremely poor, depainting at a very slow rate and using a large amount of media.

EXAMPLE 3

Comparative Cutting Efficiencies Obtained With Sulfate Blasting Media Compared With Bicarbonate Blasting Media Four types of aluminum test strips ("Almen" test strips, ù" long, è" wide) were subjected to saturated air blasts containing the blasting media described below. Almen 2024T3 bare strips and Almen 7075T6 bare strips are standard aircraft aluminum alloys. Almen 2024T3 Alclad strips and Almen 7075T6 Alclad strips are standard aircraft aluminum alloys coated with a thin surface layer of pure aluminum. The media were applied at a flow rate of 3 pounds per minute under 60 psi blast pressure, with the blast nozzle standing off from the test panels by 18 inches and utilizing a 60° blast angle. Water was fed into the saturated air blast stream under 200 psi, at a rate of 0.4 gallons per minute.

Blasting media containing sodium sulfate having a 250 micron approximate average particle size (Sample 1) and blasting media containing sodium bicarbonate having a 275 micron approximate average particle size (Sample 2) were tested. 0.5% hydrophobic silica (Aerosil R 972) flow additives were incorporated in the respective blasting media.

Twelve Almen strips of each type were subjected to the blast media being tested. Cutting efficiency or abrasiveness was measured by weight loss in milligrams of the substrate Almen strip. Attack on the surface was measured by measuring the deflection or bend in thousands of an inch caused by the attack. Averages of these measurements from the twelve tests and the standard deviations (s.d.) were determined and are presented below:

TABLE 4

Comparative Cutting Efficiencies

| Abrasive | Type of Almen Strip | Time (Seconds) | Weight Loss (mg) | s.d. | Deflection (0.001") | s.d. |
| --- | --- | --- | --- | --- | --- | --- |
| Sodium Sulfate | 2024T3 bare | 1.2 | 1.38 | 0.82 | 9.63 | 0.39 |
| | 7075T6 bare | 1.2 | 0.93 | 0.31 | 2.04 | 0.32 |
| | 2024T3 alclad | 1.2 | 19.27 | 2.88 | 4.21 | 1.41 |
| | 7075T6 alclad | 1.2 | 18.06 | 4.47 | 2.21 | 0.66 |
| Sodium Bicarbonate | 2024T3 bare | 1.2 | 0.0 | 0.0 | 9.3 | 1.33 |
| | 7075T6 bare | 1.2 | 0.1 | 0.33 | 1.3 | 0.37 |
| | 2024T3 alclad | 1.2 | 9.2 | 0.71 | 4.5 | 0.69 |
| | 7075T6 alclad | 1.2 | 9.5 | 1.48 | 2.7 | 0.43 |

As shown above, sodium sulfate blast media are markedly more efficient abrasive than sodium bicarbonate blast media. Although the weight loss from blasting the Almen strips with sodium sulfate-containing blasting media is much greater than the weight loss from blasting the Almen strips with sodium bicarbonate-containing blasting media, this higher level of abrasion did not remove the surface layer of aluminum and cause excessive damage.

From the preceding disclosure, it will be seen that the present invention provides a process for cleaning or removing paint or other coatings from the surfaces of sensitive substrates, and to crystalline sodium sulfate-containing blasting media useful therein. It will be understood that various changes may be made in the blasting process and blasting media exemplified in the preferred embodiments described hereinabove without departing from the scope of the invention. Accordingly, the preceding description should be construed as illustrative and not in a limiting sense.

We claim:

1. A process for removing coatings from sensitive hard surface metal composite surfaces, masonry, stucco, plaster or wood which comprises blasting said surfaces with a high velocity fluid stream containing as a blasting medium water-soluble crystalline sodium sulfate particles, said particles having average particle sizes within the range of 50 to 1000 microns, admixed with a hydrophobic silica or hydrophobic polysiloxane flow-/anti-caking agent, or mixture thereof wherein the flow/anti-caking agent is present in an amount of from 0.05 to 2.0% by weight of the particles.

2. The process of claim 1, wherein the fluid stream is a compressed air stream under pressures of 10 to 100 psi.

3. The process of claim 1, wherein the blast stream is applied to the surface treated at a rate of 0.5 to 15 pounds of the particles per minute.

4. The process of claim 1, wherein the particles have an average particle size within the range of 150 to 500 microns.

5. The process of claim 1, wherein the flow/anti-caking agent is a hydrophobic silica substantially free of non-hydrogen bonded silanol groups and absorbed water.

6. A blasting medium for removing coatings from sensitive hard surfaces, comprising water-soluble crystalline sodium sulfate particles, said particles having average particle sizes within the range of 100 to 250 microns, in admixture with a hydrophobic silica or hydrophobic polysiloxane flow/anti-caking agent, or mixture thereof in an amount of from 0.1 to 1.0% by weight of the particles.

7. The blasting medium of claim 6, wherein the flow-/anti-caking agent is a hydrophobic silica substantially free of non-hydrogen bonded silanol groups and absorbed water.

8. The blasting medium of claim 6, wherein the particles have an average particle size within the range of 200 to 250 microns.

9. A process for removing coatings from sensitive hard surfaces, which comprises blasting said surfaces with a substantially saturated compressed air stream under pressure of 10 to 100 psi, said stream containing as a blasting medium water-soluble sodium sulfate particles, said particles having particle sizes within the range of 100 to 250 microns, in admixture with from 0.1 to 1.0% of a hydrophobic silica flow/anti-caking agent, by weight of the particles, wherein the blast stream is applied to the surface at a rate of 0.5 to 15 pounds of the particles per minute.

10. The process of claim 9, wherein the hydrophobic silica is substantially free of non-hydrogen bonded silanol groups and absorbed water.

* * * * *